United States Patent
Cheng et al.

(10) Patent No.: US 6,518,148 B1
(45) Date of Patent: Feb. 11, 2003

(54) METHOD FOR PROTECTING STI STRUCTURES WITH LOW ETCHING RATE LINERS

(75) Inventors: Chien-Li Cheng, Hsinchu (TW); Kern-Huat Ang, Johor (ML); Chun-Hung Peng, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/947,634

(22) Filed: Sep. 6, 2001

(51) Int. Cl.⁷ ............................................. H01L 21/762
(52) U.S. Cl. ...................................... 438/437; 438/435
(58) Field of Search ................................ 438/424, 435, 438/437, 445, FOR 227; 148/DIG. 50

(56) References Cited

U.S. PATENT DOCUMENTS 4,580,330 A * 4/1986 Pollack et al. ....... 148/DIG. 50
5,658,822 A * 8/1997 Wu et al. .................... 438/446
5,963,820 A * 10/1999 Jeng ........................... 438/444
6,159,823 A * 12/2000 Song et al. ................. 438/437
6,358,818 B1 * 3/2002 Wu ............................ 438/431

FOREIGN PATENT DOCUMENTS

DE          19902999 A1 *  7/1999   ......... H01L/21/762

* cited by examiner

Primary Examiner—George Fourson
(74) Attorney, Agent, or Firm—Tung & Associates

(57) ABSTRACT

A method for manufacturing shallow trench isolation (STI) structures in semiconductor device manufacturing including a method for minimizing divot formation in a shallow trench isolation process is disclosed. A trench liner oxide is deposited and then removed and recessions adjacent a trench are formed to be replaced by an etching resistant layer which covers the recessions to form a protective collar over the trench opening corners.

20 Claims, 2 Drawing Sheets

METHOD FOR PROTECTING STI STRUCTURES WITH LOW ETCHING RATE LINERS

FIELD OF THE INVENTION

This invention generally involves a method for manufacturing shallow trench isolation (STI) structures in semiconductor device manufacturing and more particularly to a method for reducing divot formation at trench corners during an etching process.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the separation of different devices or different functional regions. With the high integration of the semiconductor devices, improper electrical isolation among devices will cause current leakage, and the current leakage can consume a significant amount of power as well as compromise functionality. Among some examples of reduced functionality include latch-up, which can damage the circuit temporarily or permanently, noise margin degradation, voltage shift and cross-talk.

Shallow trench isolation (STI), is the preferred electrical isolation technique especially for a semiconductor chip with high integration. Broadly speaking, conventional methods of producing a shallow trench isolation feature include: forming a hard mask over the targeted trench layer, patterning a soft mask over the hard mask, etching the hard mask through the soft mask to form a patterned hard mask, and thereafter etching the targeted trench layer to form the shallow trench isolation feature. Subsequently, the soft mask is removed (e.g., stripped) and the shallow trench isolation feature is back-filled with a dielectric material.

In the STI technique, the shallow trench isolation area is first defined to form isolation trenches surrounded by areas of wafer having a pad oxide layer and a polish-stop nitride layer on the surface. The isolation trench is then thermally oxidized to form a thin oxide layer on the isolation trench surfaces. A thin nitride liner is often first deposited inside the isolation trench surfaces to prevent stress during the subsequent oxidation steps because the stress causes dislocations in the silicon wafer. The isolation trench is then filled with a chemical vapor deposited (CVD) oxide and chemically mechanically polished (CMP) back to the polish-stop nitride layer to form a planar surface. The polish-stop nitride layer is then removed. At this time, if there is a nitride liner, exposed areas of the nitride liner are etched back as well, creating a divot (depression). If there is no nitride liner, a divot can still form in the $SiO_2$ surface adjacent to the Silicon due to stress at the $SiO_2$ interface. The pad oxide is then removed by a wet etch, usually hydrofluoric acid (HF), which may also cause the divot to grow further. The formation of such divots may affect the electrical integrity of semiconductor devices in a number of ways such as, example, altering the threshold voltage of a field effect transistor (FET).

Referring to FIG. 1, which shows a cross-sectional view of a typical trench isolation structure 10 during a stage of an STI process, it can be seen that divots (depressions or voids) form at the corners 12 of the trench due to preferential etching away of an oxide trench liner material 18 following a hydrofluoric acid (HF) treatment. The HF treatment is typically used to remove a pad oxide layer (not shown) overlying the silicon substrate 14 after removing the polish stop nitride layer overlying the pad oxide layer (not shown). Typically the oxide trench liner 18 material is deposited inside the trench following trench formation. The oxide trench liner 18 layer serves several purposes including reducing stress in the semiconductor substrate 14 induced when forming the trench, provides some minimal rounding of the trench corners, and some protection against divot formation during a planarization procedure to remove excess trench filling material. The trench corners however, are particularly susceptible to defects induced by stress and are likewise more susceptible to form divot formation, as shown at 12, when subjected to wet etching processes with, for example, hydrofluoric acid (HF).

In order to solve problems related to divot formation in general, methods have been suggested, for example, where an oxide spacer is formed after the polish stop nitride layer is removed. However, problems still occur when using the oxide spacer because there is no etch stop and it is possible to damage the underlying silicon wafer during the reactive ion etch (RIE) process used to form the oxide spacer. Additionally, if the oxide spacer is too thin, it may be completely removed during the subsequent wet etches and divots may form.

P. C. Fazan, et al., propose a method for eliminating the corner effects in U.S. Pat. No. 5,433,794 entitled "SPACERS USED TO FORM ISOLATION TRENCHES WITH IMPROVED CORNERS". They create a smooth trench profile with a self-aligned cap or dome. The isolating material is deposited extending over the peripheral edge of the trench, thereby covering at least a portion of the substrate surrounding the trench, and substantially limiting leakage of the active devices disposed on the substrate.

More recently, another method has been proposed to solve the problem of divot formation in general, using spacer formation. In U.S. Pat. No. 5,923,991, Bronner et al. propose the use of a spacer, similar to that suggested by Fazan et al. The spacer is of a material that is etched selectively to silicon dioxide during a reactive ion etch process and additionally has a low etch rate in hydrofluoric acid (HF). According to this method, the trenches are lined with thermally grown oxide followed by a liner of silicon nitride. The trenches are then completely filled with a chemical vapor deposited silicon dioxide. The silicon nitride layer is then removed selectively to the oxide which forms divots. Next, a spacer material with low etch rates to hydrofluoric acid (HF) solutions is deposited over the entire surface. The spacer material is then reactive ion etched (RIE) directionally to form spacers adjacent the edges of the silicon dioxide trench-filling material that have not been planarized. Although the silicon nitride liner is still etched during the initial silicon nitride polish stop removal step, the spacers will protect the silicon dioxide next to the etched liner during the subsequent wet etches, which are performed to remove the pad oxide and planarize the surface.

However, what is needed is a process with fewer processing steps with protective layering providing more effective protection against divot formation, especially at trench corners which may be more susceptible to material removal (divot formation) during wet etches, with for example, hydrofluoric acid (HF).

It is therefore an object of the invention to provide a method of protecting trench corners in a shallow trench isolation process (STI) from divot formation during wet etches with, for example, hydrofluoric acid (HF).

SUMMARY OF THE INVENTION

To achieve the foregoing and other objects, and in accordance with the purposes of the present invention, as embodied and broadly described herein, the present invention provides a method for minimizing divot formation in a shallow trench isolation process.

According to a first embodiment, the present invention provides a method for minimizing divot including providing a substrate including a silicon substrate with a pad oxide layer formed over the silicon substrate and a nitride layer formed over the pad oxide layer and a trench opening extending through said nitride layer and pad oxide layer into the silicon substrate; growing a liner oxide material conformally over a portion of the trench opening extending into the silicon substrate; removing the liner oxide material including forming at least one recession adjacent the trench opening by removing a portion of the pad oxide layer adjacent to the trench opening; and, conformally depositing an etching resistant layer having an etch rate lower than a silicon oxide etch rate over the nitride layer including the trench opening extending through said nitride layer and pad oxide layer into the silicon substrate.

In related embodiments the etching process includes the use of a hydrofluoric acid solution. Further, the pad oxide layer includes silicon oxide. Further yet, the nitride layer includes silicon nitride. Further yet, the liner oxide includes silicon oxide. Further yet, the etching resistant layer is selected from the group consisting of silicon nitride, silicon oxynitride, and titanium nitride.

In yet a further related embodiment, the method according to the present invention includes removing the liner oxide material to include removing at least a portion of the pad oxide material extending about 200 Angstroms to about 1000 Angstroms in a direction substantially parallel to a silicon substrate surface adjacent to the trench opening. Further, the etching resistant layer is conformally deposited over the at least one recession to form a collar over corners defining the trench opening.

Related embodiments are presented that will be become clear as presented below in the Detailed Description and as further defined by the associated claims.

DETAILED DESCRIPTION OF THE PREFERRED EMBODIMENTS

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
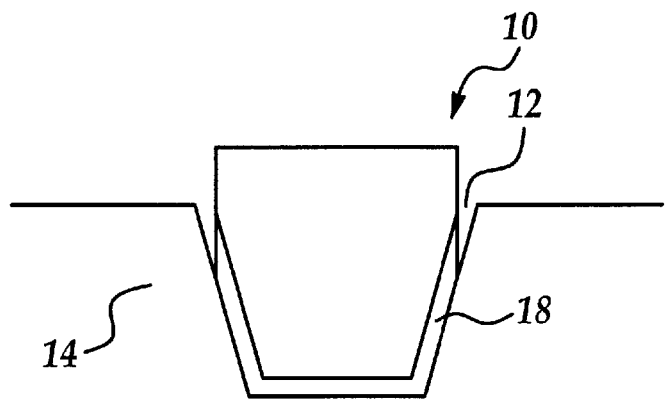
FIG. 1 is a cross-sectional view of an STI structure at a stage in an STI process according to the prior art.
Figure 2:
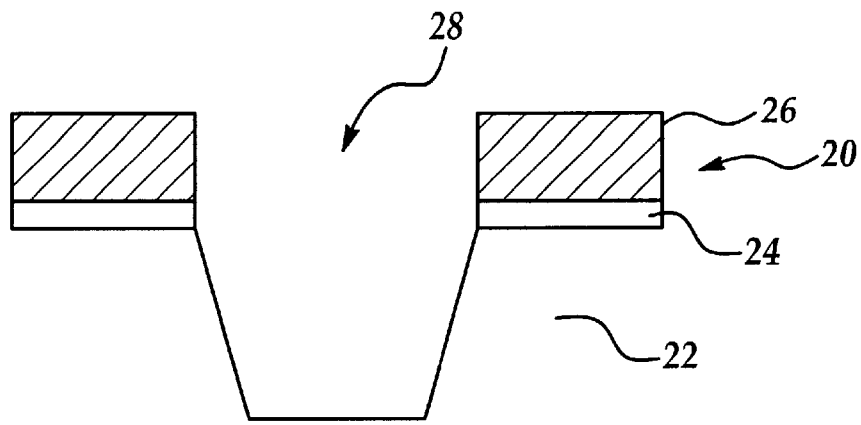
FIG. 2 is a cross-sectional view of an STI structure at a stage in an STI process according to the present invention.

Referring to FIG. 2, a cross sectional view of a single trench structure 20 is shown at a stage in an STI process and in accordance with the first embodiment of the present invention; a silicon substrate 22 with a pad oxide layer 24 formed over the silicon substrate 22 and a nitride layer 26 formed over the pad oxide layer 24 and a trench opening 28 extending through said nitride layer 26 and pad oxide layer 24 into the silicon substrate;

In a typical STI process a semiconductor substrate 22 is provided. The semiconductor substrate 22 typically comprises monocrystalline silicon. A pad oxide layer 24 (silicon oxide e.g., $SiO_2$) is grown over the semiconductor substrate 22. The purpose of the pad oxide layer 24 is to provide a good adhesion layer for the silicon nitride layer 26 and to reduce surface stress in the semiconductor substrate 22. The pad oxide layer 24 is thermally grown to a thickness of between about 100 Angstroms and 300 Angstroms using conventional thermal processes.

The silicon nitride layer 26 is deposited overlying the pad oxide layer 24. The silicon nitride layer 26 can serve as both a hard mask during etching of the shallow trenches openings 28 and as a polish stop during chemical electromechanical polishing (CMP). The silicon nitride layer is preferably deposited using a low pressure chemical vapor deposition (LPCVD) process to a thickness of between about 1,000 Angstroms and 3,000 Angstroms.

In forming the trench openings 28, the silicon nitride layer 26 and the pad oxide layer 24 are patterned by conventional photolithographic processes to form a hard mask. The openings in the hard mask correspond to patterned trenches in the semiconductor substrate 22. In a conventional photolithographic process, photoresist is coated, exposed, and developed to reveal portions of the silicon nitride layer 26 that will be etched away.

A conventional dry anisotropic etching process may be used to create the trenches. Typically, the trenches are etched to a depth of between about 1,500 Angstroms and 3,500 Angstroms deep.

Figure 3:
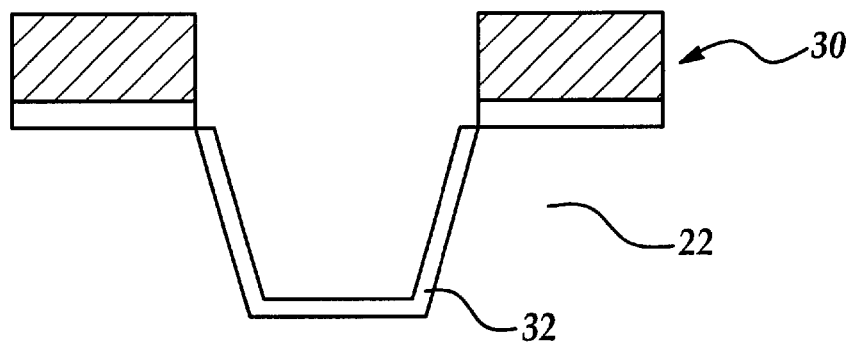
FIG. 3 is a cross-sectional view of an STI structure at a stage in an STI process after forming a trench liner oxide according to the present invention.

Referring to FIG. 3 a cross sectional view of a single trench structure 30 is shown at a stage in an STI process. At this stage, a trench liner silicon oxide (layer) 32 is thermally grown over the silicon substrate 22 by a conventional thermal oxidation technique to form a conformally grown oxide layer of from about 200 to about 1000 Angstroms in thickness. A thermal oxidation in a dry or wet oxygen containing ambient at a temperature of about 800–1100° C. is a suitable method to grow silicon oxide layer 30 on the silicon substrate 22. Alternatively, oxide layer 32 can be deposited by using low pressure chemical vapor deposition (LPCVD) at a temperature in the range of about 400–750° C. It is believed the trench liner oxide 32 serves to relieve stresses and repair defects induced during trench formation.

Figure 4:
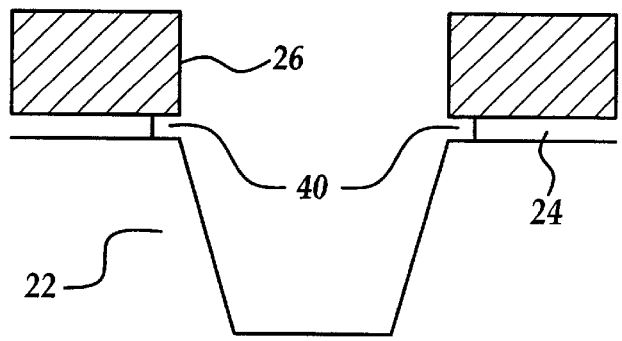
FIGS. 4 to 7 are cross-sectional views of an STI structure at different stages in an STI process according to the present invention.

Next, as shown in FIG. 4, the trench liner oxide layer 32 of FIG. 3 formed over the silicon substrate 22 is removed and the pad oxide layer 24 is preferentially etched substantially along the surface of the silicon substrate to form a recession 40 adjacent to the trench edge between the silicon substrate 22 and silicon nitride 26 layer. The typical method of removing the oxide layer 32 is wet etching by dipping the substrate 22 into a hydrofluoric acid (HF) solutions.

Figure 5:
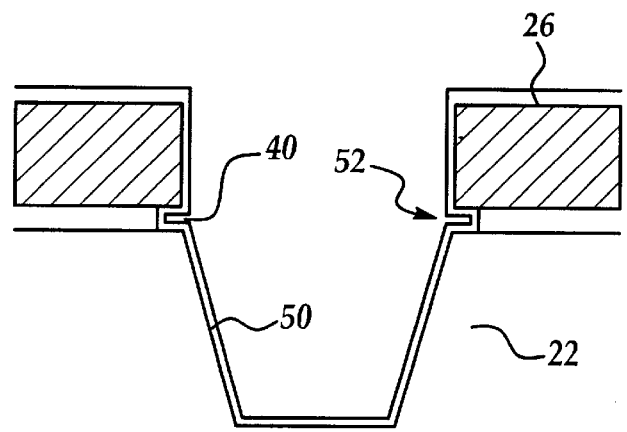

Now referring to FIG. 5, an etching resistant layer (liner) 50 is deposited conformally over the substrate to include the silicon substrate 22, the pad oxide recession 40 adjacent to the trench edge, and the silicon nitride layer 26. The etching resistant layer 50 is deposited conformally such that the etching resistant layer 50 follows the of outline of the pad oxide recession 40 to form a collar 52 of etching resistant liner material (layer) 50 over the corners of the trench opening. The conformally deposited etching resistant layer 50 is also formed over the silicon nitride layer 26. The etching resistant layer 50 includes a material that is comparatively resistant to acidic etching (or has a comparatively lower etching rate) compared to a silicon oxide (e.g., $SiO_2$). While the etching resistant layer is preferably resistant to hydrofluoric acid (HF) solutions, it will be appreciated that the etching resistant layer may also be selected to be resistant to phosphoric acid which may also be used as an etchant.

The etching resistant layer preferably is selected to include nitride materials such as silicon nitride, silicon oxynitride and titanium nitride. In addition, the etching resistant layer 50 is preferably deposited by a low pressure chemical vapor deposition (LPCVD) process or a plasma enhanced chemical vapor deposition (PECVD) at a temperature of about 400–900° C. with a thickness of about 100 to 500 angstroms.

Figure 6:
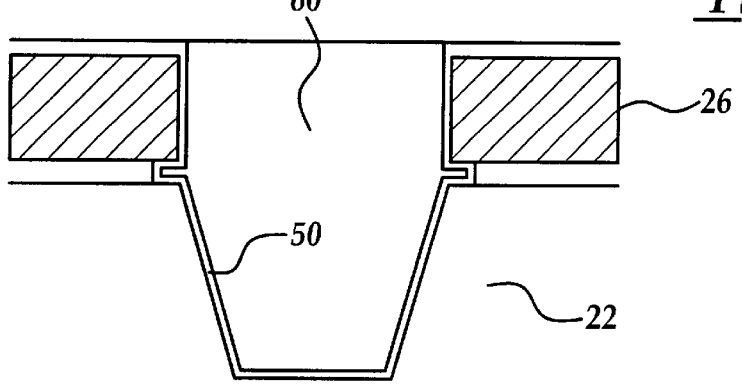

Referring FIG. 6, an insulating layer of oxide 60 with a thickness of about 5000–10000 Angstroms is formed on the silicon substrate 22 to fill the trench opening 28 of FIG. 2. The insulating layer 60 is preferably a silicon oxide layer, which may be formed by APCVD (atmospheric pressure CVD) where the reactant source for forming the silicon oxide layer includes ozone ($O_3$) and TEOS-oxide. Other suitable methods for forming this thick CVD oxide layer are LPCVD (low-pressure CVD), PECVD (plasma-enhanced CVD) or HDPCVD (high-density plasma CVD) with TEOS-oxide, boro-phospho silicate glass (BPSG), phospho-silicate glass (PSG), boro silicate glass, (BSG), or undoped silicate glass (USG), and so on. The oxide layer 60 is then typically densified using a conventional furnace and a rapid thermal process as is well known in the art at a temperature from about 800° C. to 1100° C.

After filling the trench with oxide insulating layer 60, a portion of the insulating layer 60 is then removed by CMP to expose the etching resistant layer 50 over the silicon nitride layer 26.

Figure 7:
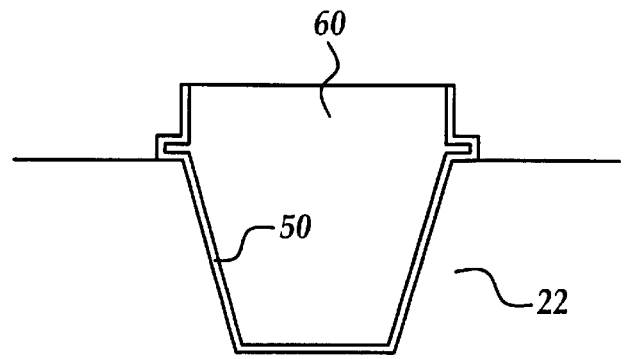

Finally referring to FIG. 7, the silicon nitride layer 26 of FIG. 6 and the pad oxide layer 24 of FIG. 6 are removed by a wet etching step. The typical method of removing the silicon nitride layer and pad oxide layer is by wet etching which includes dipping the substrate 22 into a hydrofluoric acid (HF) solution. The etching resistant liner layer 50 and the insulating oxide layer 60 are left to complete the STI structure.

According to the above process, the step of forming a trench liner oxide and removing it prior to deposition of an etching resistant layer advantageously serves to repair defects introduced in a dry etching process to form the trench opening. Further, the formation of the collar of protective etching resistant material at the trench corners advantageously serves to protect the trench corners from subsequent etching or polishing procedures, thereby reducing the incidence of trench corner erosion (divot formation). As a result, according to the present invention, trench isolation is improved and electrical functionality problems associated with current leakage are avoided.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for minimizing divot formation in a shallow trench isolation process comprising the steps of:

providing a substrate including a silicon substrate with a pad oxide layer formed over the silicon substrate and a nitride layer formed over the pad oxide layer and a trench opening extending through said nitride layer and pad oxide layer into the silicon substrate;

growing a liner oxide material conformally over a portion of the trench opening extending into the silicon substrate;

removing the liner oxide material including forming at least recession adjacent the trench opening by removing a portion of the pad oxide layer adjacent to the trench opening; and conformally depositing an etching resistant layer having an etch rate lower than a silicon oxide etch rate over the nitride layer including the trench opening extending through said nitride layer and pad oxide layer into the silicon substrate.

2. The method of claim 1, wherein the method further comprises the steps of:

filling the trench opening with an oxide material;

planarizing the trench opening; and removing the nitride layer and the pad oxide layer by an etching process such that divot formation adjacent the trench opening is reduced by the etching resistant layer.

3. The method of claim 2, wherein the etching process includes the use of a hydrofluoric acid solution.

4. The method of claim 1, wherein the pad oxide layer comprises silicon oxide.

5. The method of claim 1, wherein the nitride layer comprises silicon nitride.

6. The method of claim 1, wherein the liner oxide comprises silicon oxide.

7. The method of claim 1, wherein the liner oxide is grown by a dry oxidation process at a temperature of about 800° C. to about 1100° C.

8. The method of claim 1, wherein the step of removing the liner oxide material further comprises removing at least a portion of the pad oxide material extending about 200 Angstroms to about 1000 Angstroms in a direction substantially parallel to a silicon substrate surface adjacent to the trench opening.

9. The method of claim 1, wherein the etching resistant layer is selected from the group consisting of silicon nitride, silicon oxynitride, and titanium nitride.

10. The method of claim 1, wherein the step of conformally depositing an etching resistant layer includes conformally depositing such that the etching resistant layer is deposited over the at least one recession to form a collar over corners defining the trench opening.

11. An improved method of protecting isolation trenches from etching in a shallow trench isolation (STI) process comprising:

growing a liner oxide material conformally over a portion of a trench opening extending into a silicon substrate;

removing the liner oxide material including forming at least one recession by removing a portion of a pad oxide layer overlying a silicon substrate adjacent to the trench opening; and depositing an etching resistant material having an acidic etching rate relatively lower than a silicon oxide acidic etching rate conformally over a trench isolation structure to include the at least one recession.

12. The method of claim 1, wherein the method further comprises the steps of:

filling the trench opening with an oxide material;

planarizing the trench opening; and removing layers overlying the silicon substrate including the pad oxide layer by an acidic etching process such that divot formation adjacent the trench openings is reduced by the etching resistant layer.

13. The method of claim 12, wherein the acidic etching process comprises an acidic solution selected from the group consisting of a hydrofluoric acid solution and phosphoric acid solution.

14. The method of claim 1, wherein the pad oxide layer comprises silicon oxide.

15. The method of claim 1, wherein a silicon nitride layer overlies the pad oxide layer.

16. The method of claim 1, wherein the liner oxide comprises silicon oxide.

17. The method of claim 1, wherein the liner oxide is grown by a dry oxidation process at a temperature of about 800° C. to about 1100° C.

18. The method of claim 1, wherein the step of removing the liner oxide material further comprises removing at least a portion of the pad oxide material extending about 200 Angstroms to about 1000 Angstroms in a direction substantially parallel to a silicon substrate surface adjacent to the trench opening.

19. The method of claim 1, wherein the etching resistant material is selected from the group consisting of silicon nitride, silicon oxynitride, and titanium nitride.

20. The method of claim 19, wherein the etching resistant material is deposited in a thickness of about 100 Angstroms to about 500 Angstroms.

\* \* \* \* \*